(12) United States Patent
Iwamoto et al.

(10) Patent No.: US 9,870,961 B2
(45) Date of Patent: Jan. 16, 2018

(54) WAFER PROCESSING METHOD

(71) Applicant: DISCO CORPORATION, Tokyo (JP)

(72) Inventors: Taku Iwamoto, Tokyo (JP); Hironari Ohkubo, Tokyo (JP); Junichi Kuki, Tokyo (JP); Kentaro Odanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/388,168

(22) Filed: Dec. 22, 2016

(65) Prior Publication Data
US 2017/0186656 A1    Jun. 29, 2017

(30) Foreign Application Priority Data
Dec. 28, 2015    (JP) .................. 2015-256353

(51) Int. Cl.
| | |
|---|---|
| H01L 21/268 | (2006.01) |
| H01L 21/66 | (2006.01) |
| H01L 21/67 | (2006.01) |
| H01L 21/68 | (2006.01) |
| H01L 21/683 | (2006.01) |
| H01L 21/687 | (2006.01) |
| H01L 23/544 | (2006.01) |
| H01S 3/11 | (2006.01) |
| H01S 3/16 | (2006.01) |

(52) U.S. Cl.
CPC ............ H01L 22/20 (2013.01); H01L 21/268 (2013.01); H01L 21/67282 (2013.01); H01L 21/681 (2013.01); H01L 21/6838 (2013.01); H01L 21/68764 (2013.01); H01L 22/32 (2013.01); H01L 23/544 (2013.01); H01S 3/11 (2013.01); H01S 3/163 (2013.01); H01L 2223/5446 (2013.01)

(58) Field of Classification Search
CPC .................... H01L 21/78–21/86; H01L 22/12
See application file for complete search history.

(56) References Cited

U.S. PATENT DOCUMENTS

2013/0217153 A1*    8/2013  Knippels .............. B23K 26/083
                                                                438/7

FOREIGN PATENT DOCUMENTS

JP    2012-151225    8/2012

* cited by examiner

*Primary Examiner* — Daniel Shook
(74) *Attorney, Agent, or Firm* — Greer Burns & Crain Ltd.

(57) ABSTRACT

Disclosed herein is a wafer processing method including a processed position measuring step of imaging an area including a beam plasma generated by applying a pulsed laser beam to a wafer, by using an imaging unit during the formation of a laser processed groove on the wafer, and next measuring the positional relation between the position of the beam plasma and a preset processing position. Accordingly, it is possible to check whether or not the laser processed groove is formed at a desired position, in real time during laser processing. If the position of the laser processed groove is deviated, the processed position can be immediately corrected.

1 Claim, 6 Drawing Sheets

WAFER PROCESSING METHOD

BACKGROUND OF THE INVENTION

Field of the Invention

The present invention relates to a wafer processing method for processing a wafer as measuring the positional relation between a preset processing position and an actually processed position by laser processing of the wafer.

Description of the Related Art

In a semiconductor device fabrication process, a plurality of electronic circuits such as integrated circuits (ICs) and large-scale integrations (LSIs) are formed on the front side of a substantially disk-shaped workpiece such as a semiconductor wafer. The back side of the workpiece thus having the plural electronic circuits is ground to reduce the thickness of the workpiece to a predetermined thickness. Thereafter, a device area of the workpiece where the electronic circuits are formed is cut along division lines called streets by applying a laser beam to thereby divide the workpiece into a plurality of device chips (see Japanese Patent Laid-Open No. 2012-151225, for example).

SUMMARY OF THE INVENTION

However, there is a problem such that the focused point of the laser beam cannot be set at a preset processing position due to any factor relating to a laser processing apparatus, such as strain generated in an optical system for the laser beam, so that the workpiece cannot be processed at a desired position.

It is therefore an object of the present invention to provide a wafer processing method which can process a wafer at a desired position by using a laser beam even when there is an error in processing position due to any factor relating a laser processing apparatus.

In accordance with an aspect of the present invention, there is provided a wafer processing method for processing a wafer by using a laser processing apparatus including pulsed laser beam applying means to apply a pulsed laser beam from the pulsed laser beam applying means to the wafer, the wafer including a substrate and a plurality of devices formed on the front side of the substrate in a plurality of separate regions defined by a plurality of crossing division lines, the wafer processing method including an alignment step of detecting the division lines of the wafer by using alignment means included in the laser processing apparatus; a laser processed groove forming step of applying the pulsed laser beam from the pulsed laser beam applying means to the wafer along each division line after performing the alignment step, thereby forming a laser processed groove along each division line; and a processed position measuring step of imaging an area including a beam plasma generated by applying the pulsed laser beam from the pulsed laser beam applying means to the wafer, by using imaging means included in the laser processing apparatus, while performing the laser processed groove forming step, and next measuring the positional relation between the position of the beam plasma and a preset processing position.

In the case that a plurality of metal patterns for testing are formed on the division lines of the wafer at given intervals, the wafer processing method of the present invention further includes a metal pattern position storing step of storing information on the intervals and positions of the metal patterns into storage means included in the laser processing apparatus before performing the alignment step. In this case, the positional relation mentioned above is measured in the processed position measuring step at any position where the metal patterns are not formed, according to the information on the intervals and positions of the metal patterns previously stored in the metal pattern position storing step.

The wafer processing method of the present invention includes the processed position measuring step of imaging an area including a beam plasma generated by applying a pulsed laser beam to a wafer, by using the imaging means while performing the laser processed groove forming step, and next measuring the positional relation between the position of the beam plasma and a preset processing position. Accordingly, it is possible to check whether or not the laser processed groove is formed at a desired position, in real time during laser processing. If the position of the laser processed groove is deviated, the processed position can be immediately corrected.

Further, there is a possibility that the size and brightness of the beam plasma at the positions where the metal patterns are formed are different from those at the positions where the metal patterns are not formed, causing erroneous recognition of the laser processed groove. According to the present invention, in the case that the metal patterns for testing are formed on the division lines of the wafer at given intervals, the intervals and positions of the metal patterns are previously stored in the storage means, and kerf check is performed so as to avoid the metal patterns. Accordingly, the kerf check can be performed without erroneous recognition, so that the wafer can be processed with high accuracy.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
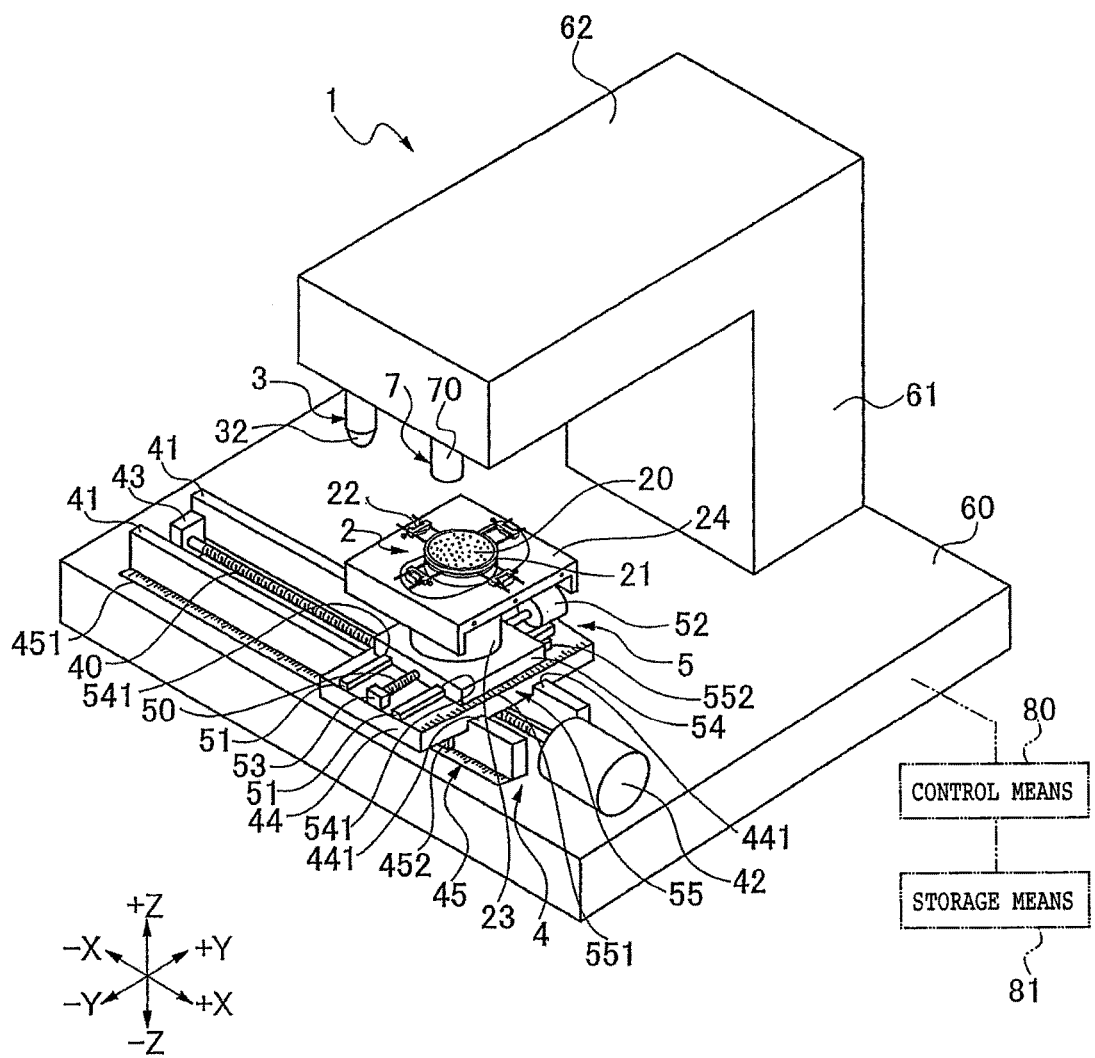
FIG. 1 is a perspective view of a laser processing apparatus for use in performing a preferred embodiment of the present invention.

Referring to FIG. 1, there is depicted a laser processing apparatus 1 for use in performing a preferred embodiment of the present invention. The laser processing apparatus 1 is an apparatus for applying a pulsed laser beam to a wafer held on a chuck table 2 by using laser beam applying means 3, thereby laser-processing the wafer. The chuck table 2 is movable in the X direction (+X or −X direction) by operating X moving means 4 and also movable in the Y direction (+Y or −Y direction) by operating Y moving means 5.

The chuck table 2 includes a suction holding portion 20 for holding the wafer under suction, a frame 21 for supporting the suction holding portion 20 so as to surround the same, and a clamp portion 22 fixed to the outer circumference of the frame 21. The lower portion of the chuck table 2 is connected to a rotational drive portion 23 for rotating the chuck table 2. The rotational drive portion 23 is provided with an upper cover 24.

The X moving means 4 is provided on a stationary base 60. The X moving means 4 includes a ball screw 40 extending in the X direction, a pair of guide rails 41 parallel to the ball screw 40, a motor 42 connected to one end of the ball screw 40 for rotating the ball screw 40, a bearing portion 43 for supporting the other end of the ball screw 40, and a moving base 44 having an internal nut (not depicted) threadedly engaged with the ball screw 40 and having a lower portion formed with a pair of guided grooves 441 slidably engaged with the guide rails 41. Accordingly, when the ball screw 40 is rotated normally or reversely by operating the motor 42, the moving base 44 is moved in the +X direction or −X direction as being guided by the guide rails 41. The motor 42 is controlled by control means 80 including a central processing unit (CPU), memory, etc.

The X moving means 4 is provided with X position detecting means 45 for detecting the position of the chuck table 2 in the X direction, or the X position of the chuck table 2. The X position detecting means 45 includes a linear scale 451 extending along one of the guide rails 41 and a read head 452 provided on the moving base 44 and movable along the linear scale 451 together with the moving base 44. The read head 452 transmits a pulse signal of one pulse every 1 μm, for example, to the control means 80. The control means 80 counts the number of pulses as the pulse signal input from the read head 452 to thereby recognize the X position of the chuck table 2. In the case that a pulse motor is used as the motor 42, the number of drive pulses output from the control means 80 to the pulse motor is counted to thereby recognize the X position of the chuck table 2. In the case that a servo motor is used as the motor 42, a pulse signal output from a rotary encoder for detecting the rotational speed of the servo motor is transmitted to the control means 80 and the number of pulses output from the rotary encoder is counted by the control means 80 to thereby detect the X position of the chuck table 2.

The Y moving means 5 includes a ball screw 50 extending in the Y direction, a pair of guide rails 51 parallel to the ball screw 50, a motor 52 connected to one end of the ball screw 50 for rotating the ball screw 50, a bearing portion 53 for supporting the other end of the ball screw 50, and a moving base 54 having an internal nut (not depicted) threadedly engaged with the ball screw 50 and having a lower portion formed with a pair of guided grooves 541 slidably engaged with the guide rails 51. Accordingly, when the ball screw 50 is rotated normally or reversely by operating the motor 52, the moving base 54 is moved in the +Y direction or −Y direction as being guided by the guide rails 51. The motor 52 is controlled by the control means 80.

The Y moving means 5 is provided with Y position detecting means 55 for detecting the position of the chuck table 2 in the Y direction, or the Y position of the chuck table 2. The Y position detecting means 55 includes a linear scale 551 extending along one of the guide rails 51 and a read head 552 provided on the moving base 54 and movable along the linear scale 551 together with the moving base 54. The read head 552 transmits a pulse signal of one pulse every 1 μm, for example, to the control means 80. The control means 80 counts the number of pulses as the pulse signal input from the read head 552 to thereby recognize the Y position of the chuck table 2. In the case that a pulse motor is used as the motor 52, the number of drive pulses output from the control means 80 to the pulse motor is counted to thereby recognize the Y position of the chuck table 2. In the case that a servo motor is used as the motor 52, a pulse signal output from a rotary encoder for detecting the rotational speed of the servo motor is transmitted to the control means 80 and the number of pulses output from the rotary encoder is counted by the control means 80 to thereby detect the Y position of the chuck table 2.

A support member 61 is provided on the stationary base 60 at its rear portion (end portion in the +Y direction) so as to project upward. A casing 62 extends from the upper end of the support member 61 in the −Y direction. The casing 62 is provided with the laser beam applying means 3 and alignment means 7. The alignment means 7 includes a camera 70 for imaging the wafer held on the chuck table 2. According to an image obtained by the camera 70, a laser processing position on the wafer can be detected.

Figure 2:
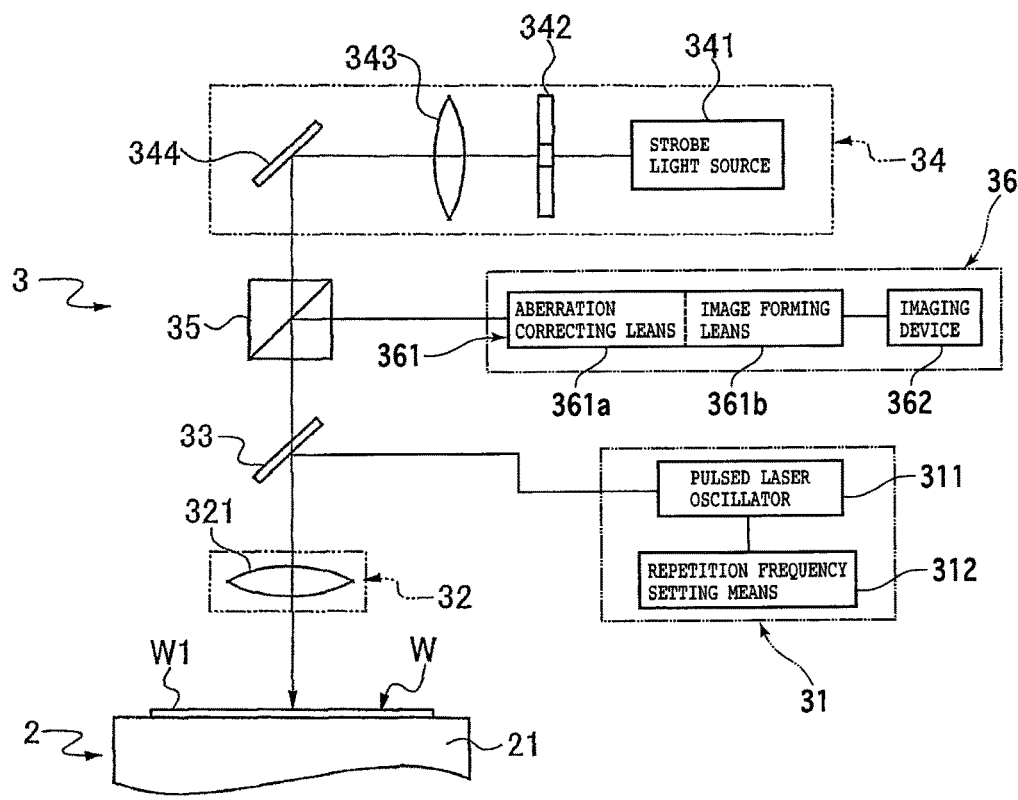
FIG. 2 is a block diagram depicting laser beam applying means included in the laser processing apparatus depicted in FIG. 1.

As depicted in FIG. 2, the laser beam applying means 3 includes pulsed laser beam oscillating means 31, focusing means 32 for focusing a pulsed laser beam LB oscillated by the pulsed laser beam oscillating means 31 and applying the pulsed laser beam LB to the wafer W held on the chuck table 2, and a dichroic mirror 33 provided between the pulsed laser beam oscillating means 31 and the focusing means 32 for guiding the pulsed laser beam LB oscillated by the pulsed laser beam oscillating means 31 to the focusing means 32. The pulsed laser beam oscillating means 31 is composed of a pulsed laser oscillator 311 and repetition frequency setting means 312 connected thereto. The focusing means 32 includes a focusing lens 321 for focusing the pulsed laser beam LB oscillated by the pulsed laser beam oscillating means 31. The dichroic mirror 33 provided between the pulsed laser beam oscillating means 31 and the focusing means 32 functions to reflect the pulsed laser beam LB oscillated by the pulsed laser beam oscillating means 31 toward the focusing means 32 and also to transmit light having a wavelength other than the wavelength of the pulsed laser beam LB.

The laser beam applying means 3 further includes strobe light applying means 34 for applying light to a path between the dichroic mirror 33 and the focusing means 32, a beam splitter 35 provided between the strobe light applying means 34 and the dichroic mirror 33 for reflecting light from the wafer W held on the chuck table 2, and imaging means 36 provided on the path of the reflected light from the beam splitter 35. The strobe light applying means 34 is composed of a strobe light source 341 such as a xenon flash lamp for emitting white light, a stop 342 for defining the field size of the white light emitted from the strobe light source 341, a lens 343 for focusing the white light passed through the stop 342 onto the wafer W held on the chuck table 2, and a direction changing mirror 344 for changing the optical path of the white light focused by the lens 343 toward the beam splitter 35. The strobe light source 341 emits light under the control by the control means 80.

The beam splitter 35 functions to guide the white light reflected by the direction changing mirror 344 of the strobe light applying means 34 toward the dichroic mirror 33 and also to guide the light from the wafer W held on the chuck table 2 toward the imaging means 36. The imaging means 36 is composed of a set lens 361 and an imaging device (charge-coupled device (CCD)) 362 for detecting an image captured by the set lens 361. The set lens 361 is composed of an aberration correcting lens 361a and an image forming lens 361b. An image signal output from the imaging means 36 is transmitted to the control means 80. As depicted in FIG. 1, the control means 80 is connected to storage means 81 having a storage element such as a memory. The control means 80 functions to control each component of the laser processing apparatus 1 according to information stored in the storage means 81.

There will now be described a method of forming a laser processed groove on the front side W1 of a wafer W depicted in FIG. 3A and checking whether or not the laser processed groove is formed at a predetermined position, by using the laser processing apparatus 1 mentioned above.

Figure 3A:
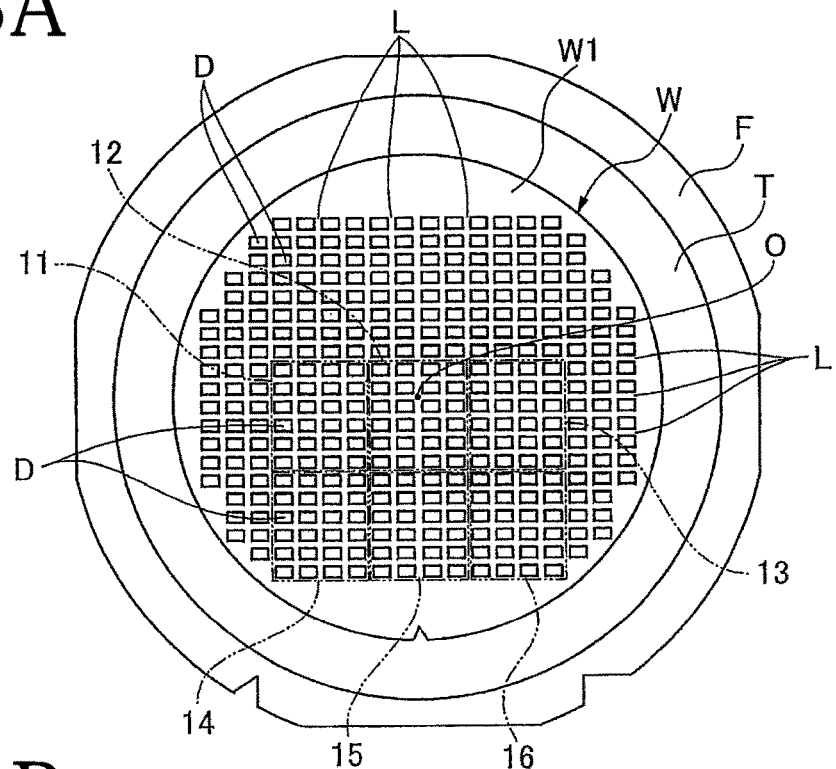
FIG. 3A is a plan view of a wafer as a workpiece.

As depicted in FIG. 3A, a plurality of crossing division lines (which will be hereinafter referred to as "lines") L are formed on the front side W1 of the wafer W to define a plurality of separate regions where a plurality of devices D are formed. The back side of the wafer W is attached to a tape T. A ring frame F is attached to the peripheral portion of the tape T. Accordingly, the wafer W is supported through the tape T to the frame F. The wafer W is held under suction through the tape T on the suction holding portion 20 of the chuck table 2 depicted in FIG. 1, and the frame F is fixed by the clamp portion 22.

Each device D constituting the wafer W is formed on the front side of a substrate such as a silicon substrate in a semiconductor device fabrication process. A circuit pattern in each device D is formed by projection exposure through a reticle in a stepper. The reticle has a circuit pattern corresponding to that in each device D. In fabricating one wafer W, a plurality of reticles are used.

Figure 3B:
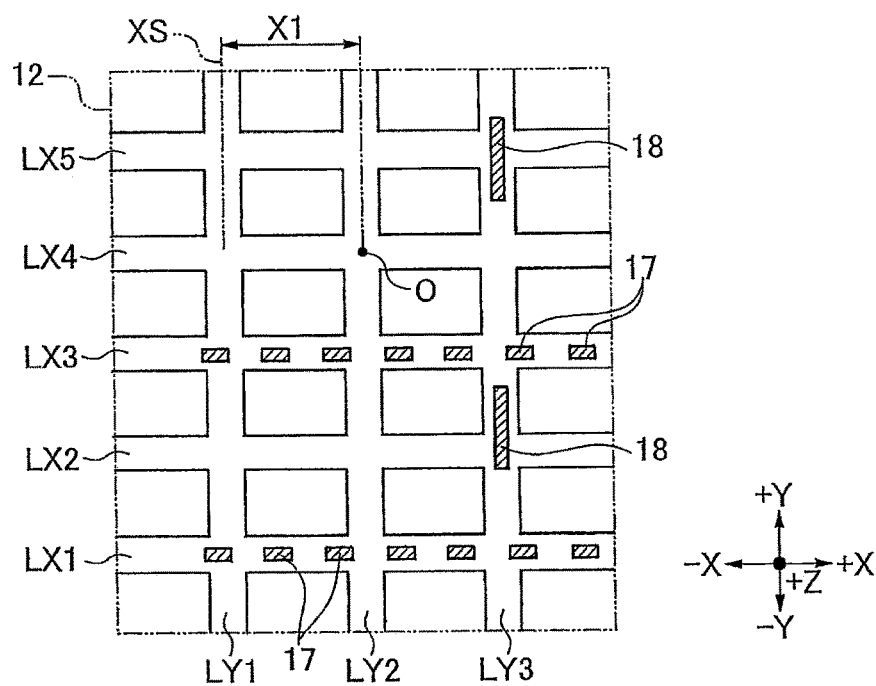
FIG. 3B is an enlarged plan view of an essential part of the wafer depicted in FIG. 3A.

The wafer W is composed of a plurality of areas divided according to the reticles to be used. For example, the wafer W depicted in FIG. 3A includes areas 11 to 16. As depicted in FIG. 3B, each of the areas 11 to 16 includes lines LX1 to LX5 extending in the X direction and lines LY1 to LY3 extending in the Y direction. The number of lines L extending in the X direction and the number of lines L extending in the Y direction are previously determined according to each reticle.

(1) Processing Conditions Setting Step
(1a) Metal Pattern Position Storing Step

As depicted in FIG. 3B, metal patterns 17 called test element group (TEG) are formed on the lines LX1 and LX3 in each of the areas 11 to 16. Further, metal patterns 18 are formed on the line LY3 in each of the areas 11 to 16. These metal patterns 17 and 18 are formed of copper, for example. The metal patterns 17 are formed on each of the lines LX1 and LX3 at given intervals. Similarly, the metal patterns 18 are formed on the line LY3 at a given interval. Accordingly, the metal patterns 17 and 18 are formed at the same positions in all of the areas 11 to 16. While the metal patterns 17 and 18 are formed on the lines LX1 and LX3 and the line LY3, respectively, in FIG. 3B, such metal patterns may be formed on any other lines. The metal patterns 17 and 18 function as test elements for use in finding out any design or production problems that may occur in each device D. The metal patterns 17 and 18 are also formed through a reticle by sputter, chemical vapor deposition (CVD), etc. Accordingly, this reticle is formed with a mask corresponding to the metal patterns 17 and 18.

As the specifications of each reticle, various items of information are previously determined as including the number of lines L extending in the X direction, the number of lines L extending in the Y direction, the lines where the metal patterns are formed, the intervals of the metal patterns, and the positions of the metal patterns. These items of information are input by an operator through any inputting means (e.g., keyboard or touch panel) (not depicted) included in the laser processing apparatus 1. The information thus input is stored into the storage means 81 depicted in FIG. 1. Further, such information may be read as the information used in the previous step from any medium into the storage means 81 and then stored into the same.

According to the information on the specifications of each reticle, the operator sets any line where the metal patterns 17 and 18 are not formed as the line subjected to checking (kerf check) of whether or not the laser processed groove is formed at a desired position, and then inputs this line into the storage means 81. In the example depicted in FIG. 3B, the line LX4 is set as a target of the kerf check.

The operator also inputs into the storage means 81 such information as which line in the reticle corresponds to the outermost line on the wafer W. For example, since the line LX1 in the area 15 depicted in FIG. 3B is the outermost line on the wafer W, the information that the line LX1 in the reticle corresponds to the outermost line is stored.

Further, the operator also stores into the storage means 81 a kerf check position XS in the X direction to be used in performing kerf check for the laser processed groove formed by laser processing. The kerf check position XS is a position displaced from the center O of the wafer W by an amount X1 in the X direction. The value of X1 is stored into the storage means 81. The operator operates the camera 70 depicted in FIG. 1 to thereby image the wafer W. As seeing an image of the wafer W displayed on a monitor (not depicted), the operator selects a position where the metal patterns 17 and 18 are not formed and then decides the value of X1.

In addition, the operator stores into the storage means 81 any information including the size (diameter) of the wafer W and an index size (the distance from the center of a certain line L to the center of its adjacent line L), which is the distance between any adjacent lines L.

(1b) Alignment Information Storing Step

Figure 4:
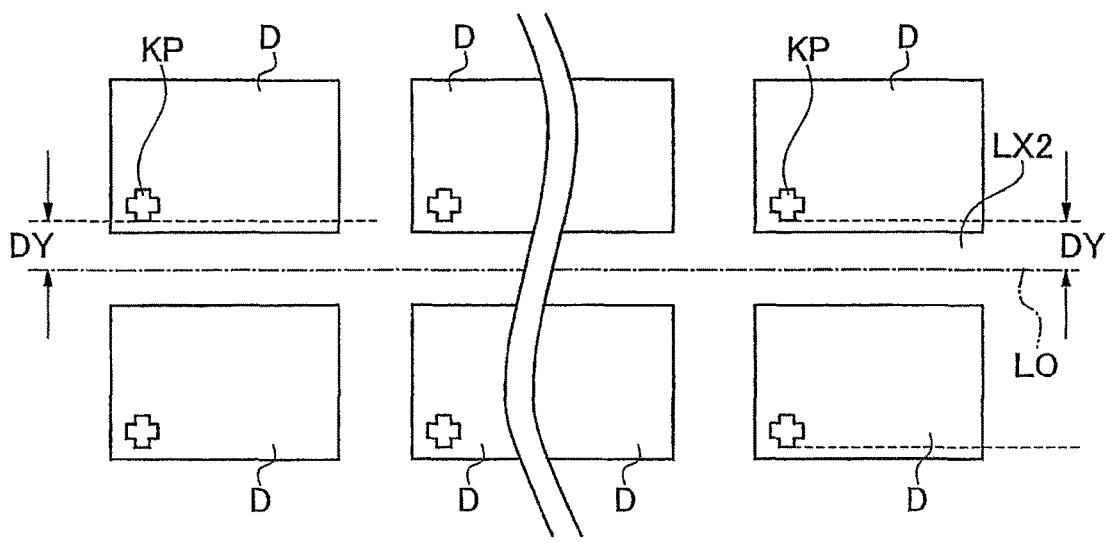
FIG. 4 is an enlarged plan view depicting the positional relation between key patterns in devices and a division line.

Further, the operator specifies a key pattern to be used in pattern matching for detecting a target line in an alignment step to be hereinafter described, and then stores an image including this key pattern into the storage means 81. For example, a specific circuit pattern having a characteristic shape in each device D, e.g., a key pattern KP depicted in FIG. 4, is previously selected as the key pattern for the pattern matching. In this case, an image including this key pattern KP is stored into the storage means 81. Further, the storage means 81 also stores a distance DY from the key pattern KP to the center LO of the adjacent line extending in the X direction (e.g., the line LX2) as depicted in FIG. 4. Further, as the key pattern, any part provided outside each device D of the wafer W for the pattern matching may be used in place of the circuit pattern formed in each device D.

(2) Alignment Step
(2a) Adjustment of the Orientation of the Wafer W

The wafer W held on the chuck table 2 is positioned below the camera 70 by moving the chuck table 2 in the −X direction from the position depicted in FIG. 1. In this condition, two key patterns KP depicted in FIG. 4, e.g., two key patterns KP formed in the two devices D located at the opposite ends in the X direction along the line LX2, are detected by pattern matching.

The control means 80 performs the pattern matching for the two key patterns KP adjacent to the specific line LX2 to detect the two key patterns KP and determine the Y coordinates of the two key patterns KP detected. When the Y coordinates of the two key patterns KP are equal to each other, the control means 80 determines that the line LX2 extends parallel to the X direction. When the Y coordinates of the two key patterns KP are not equal to each other, the control means 80 calculates an angle formed between the X axis and the line connecting the two key patterns KP and then operates the rotational drive portion 23 depicted in FIG. 1 to rotate the chuck table 2 by this angle, thereby making the line LX2 parallel to the X direction. Further, the control means 80 recognizes the Y coordinate of the center LO of the line LX2.

(2b) Calculation of the Center Position of the Wafer

Figure 5:
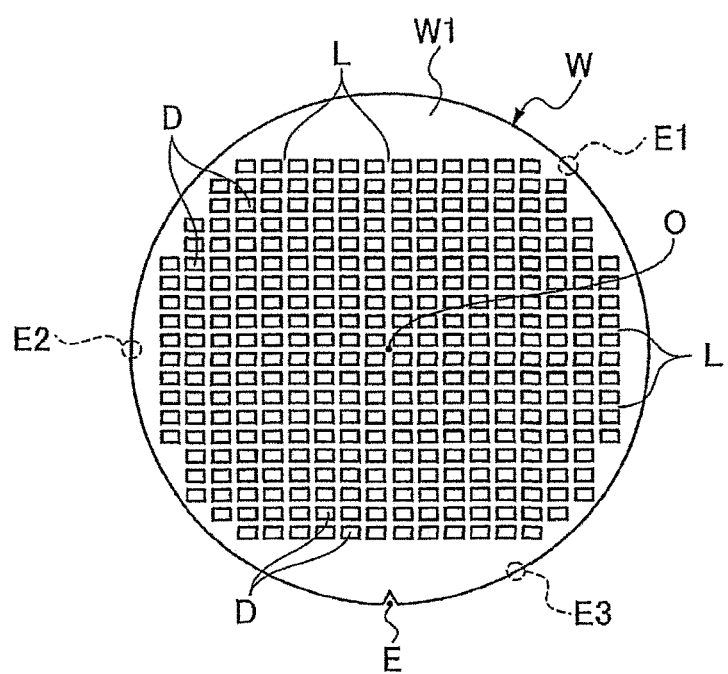
FIG. 5 is a plan view depicting the center and edge of the wafer.

Thereafter, the chuck table 2 is rotated to image a plurality of peripheral areas of the wafer W, e.g., three peripheral areas E1, E2, and E3 depicted in FIG. 5, thereby obtaining images of these peripheral areas E1 to E3 and detecting the edge of the wafer W. That is, the control means 80 determines the X-Y coordinates of the three points on the edge of the wafer W. More specifically, image processing is performed in such a manner that in the images of the peripheral areas E1, E2, and E3 a portion where the pixel value has changed in an amount not less than a given threshold is recognized as the edge, thereby obtaining the X-Y coordinates of the three points. The control means 80 determines the X-Y coordinates of the center O of the wafer W according to the X-Y coordinates of the three points.

(2c) Calculation of the Position of the Outermost Line

Thereafter, the control means 80 determines that the position spaced apart from the center O to the outer circumference of the wafer W by its radius coincides with the edge E of the wafer W, according to the size (diameter) of the wafer W previously stored in the storage means 81. The control means 80 then calculates the Y coordinate of the edge E. Thereafter, the control means 80 determines the Y coordinate of the outermost line to be first laser-processed, according to the Y coordinate of the edge E, the index size of the wafer W stored in the storage means 81, and the number of lines L extending in the X direction stored in the storage means 81. The Y coordinate of the outermost line is stored into the storage means 81. This outermost line is the line LX1 in each of the areas 14, 15, and 16. By determining the outermost line LX1 on the basis of the center O of the wafer W, the following advantage can be obtained. That is, even if the center of the chuck table 2 does not coincide with the center of the wafer W in transferring the wafer W to the chuck table 2, the position of the outermost line LX1 can be accurately obtained.

As a modification, a special target pattern for detection of the outermost line may be previously formed in any area of the wafer W other than the devices D, and the position of the outermost line may be obtained according to the positional relation between the target pattern and the outermost line. Also in this case, even if the center of the chuck table 2 does not coincide with the center of the wafer W, the position of the outermost line LX1 can be accurately obtained.

(3) Laser Processed Groove Forming Step

As described above, the information required for laser processing and check of a laser processed groove formed by laser processing is stored into the storage means 81 and the alignment step is performed. Thereafter, laser processing is actually performed along each line to form a laser processed groove, and it is then checked whether or not the laser processed groove has been formed at a desired position (kerf check).

Figure 6A:
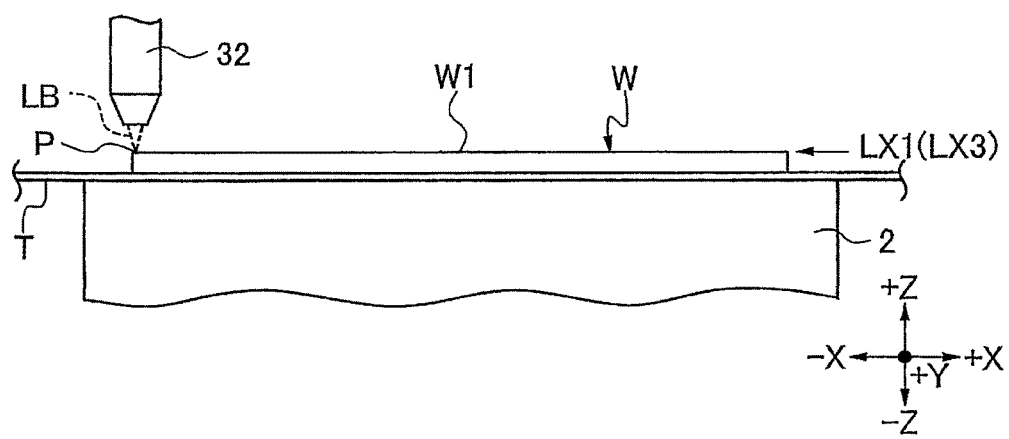
FIG. 6A is an elevational view depicting the start of laser processing along a division line.

First, the focusing means 32 is positioned directly above one end (left end as viewed in FIG. 6A) of the line LX1 as the outermost line detected in the alignment step. Further, as depicted in FIG. 6A, the focal point P of the pulsed laser beam to be applied from the focusing means 32 of the laser beam applying means 3 is set near the front side W1 of the wafer W. Thereafter, the pulsed laser beam having an absorption wavelength (e.g., 355 nm) to the wafer W is applied from the focusing means 32 and at the same time the chuck table 2 is moved in the −X direction at a predetermined feed speed by operating the X moving means 4 depicted in FIG. 1.

Figure 6B:
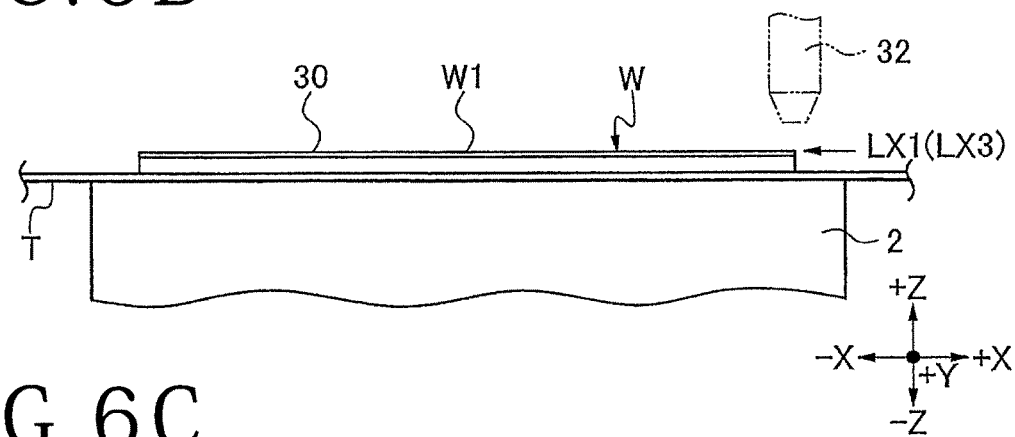
FIG. 6B is an elevational view depicting the end of laser processing along the division line depicted in FIG. 6A.
Figure 6C:
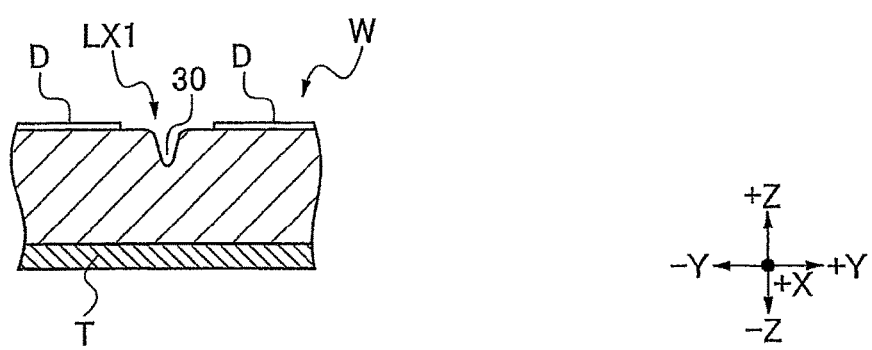
FIG. 6C is a sectional view depicting a laser processed groove formed by the laser processing depicted in FIGS. 6A and 6B.

When the other end (right end as viewed in FIG. 6B) of the line LX1 reaches the position directly below the focusing means 32, the application of the pulsed laser beam is stopped and the movement of the chuck table 2 is also stopped. As a result, a laser processed groove 30 is formed along the line LX1 on the front side W1 of the wafer W as depicted in FIGS. 6B and 6C.

For example, the laser processing is performed under the following processing conditions.

Laser beam source: YVO4 laser or YAG laser
Wavelength: 355 nm
Repetition frequency: 50 kHz
Average power: 3 W
Focused spot diameter: 10 μm
Feed speed: 100 mm/second As described later, the kerf check is performed by imaging a beam plasma generated by the application of the laser beam to the wafer W. As depicted in FIG. 3B, the metal patterns 17 are formed on the line LX1. Accordingly, if the laser processed groove 30 formed along the line LX1 is imaged to perform the kerf check, there is a possibility that the size and brightness of the beam plasma at the positions where the metal patterns 17 are formed are quite different from those at the positions where the metal patterns 17 are not formed, causing erroneous recognition of the laser processed groove. Accordingly, the kerf check is not performed for the line LX1, but the next line LX2 is subjected to laser processing.

After forming the laser processed groove 30 along the line LX1, the chuck table 2 is moved in the −Y direction by the index size stored in the storage means 81, thereby positioning the line LX2 directly below the focusing means 32. Thereafter, laser processing is performed as in the case of the line LX1. That is, the focal point P of the pulsed laser beam to be applied from the focusing means 32 is set near the front side W1 of the wafer W. In this condition, the pulsed laser beam having an absorption wavelength to the wafer W is applied from the focusing means 32. At the same time, the chuck table 2 is moved in the +X direction opposite to the feeding direction in the case of the line LX1, thereby forming a laser processed groove 30 along the line LX2.

Thereafter, the chuck table 2 is moved in the −Y direction by the index size stored in the storage means 81, thereby positioning the line LX3 directly below the focusing means 32. Thereafter, the line LX3 is subjected to laser processing in a manner similar to that for the line LX1.

Thereafter, the chuck table 2 is moved in the −Y direction by the index size stored in the storage means 81, thereby positioning the line LX4 directly below the focusing means 32. Thereafter, the line LX4 is subjected to laser processing in a manner similar to that for the line LX2. That is, the focal point P of the pulsed laser beam to be applied from the focusing means 32 is set near the front side W1 of the wafer W. In this condition, the pulsed laser beam having an absorption wavelength to the wafer W is applied from the focusing means 32. At the same time, the chuck table 2 is moved in the +X direction opposite to the feeding direction in the case of the line LX3, thereby forming a laser processed groove 30 along the line LX4.

(4) Processed Position Measuring Step

In the metal pattern position storing step mentioned above, the line LX4 has been set as the target of the kerf check and stored in the storage means 81. Accordingly, in this processed position measuring step, the control means 80 reads out the information on the line LX4 stored in the storage means 81, and then performs the kerf check for the laser processed groove 30 formed along the line LX4.

The repetition frequency of the pulsed laser beam to be oscillated by the pulsed laser beam oscillating means 31 of the laser beam applying means 3 is 50 kHz in this preferred embodiment. Accordingly, one pulse of the pulsed laser beam LB is applied every 20 microseconds as depicted in FIG. 7.

An image for the kerf check is obtained at given time intervals. In the example depicted in FIG. 7, after applying the second pulse of the pulsed laser beam LB, the control means 80 operates the strobe light source 341 of the strobe light applying means 34 and opens a shutter in the imaging means 36 with timing t1. Accordingly, during this timing t1, the imaging means 36 obtains an image of the beam plasma of the pulsed laser beam LB and also obtains an image of the processing area. Further, after 100 microseconds has elapsed from the time of emission of the light from the strobe light source 341, the strobe light source 341 is operated again to emit light and similarly obtain an image from the imaging means 36.

Figure 7:
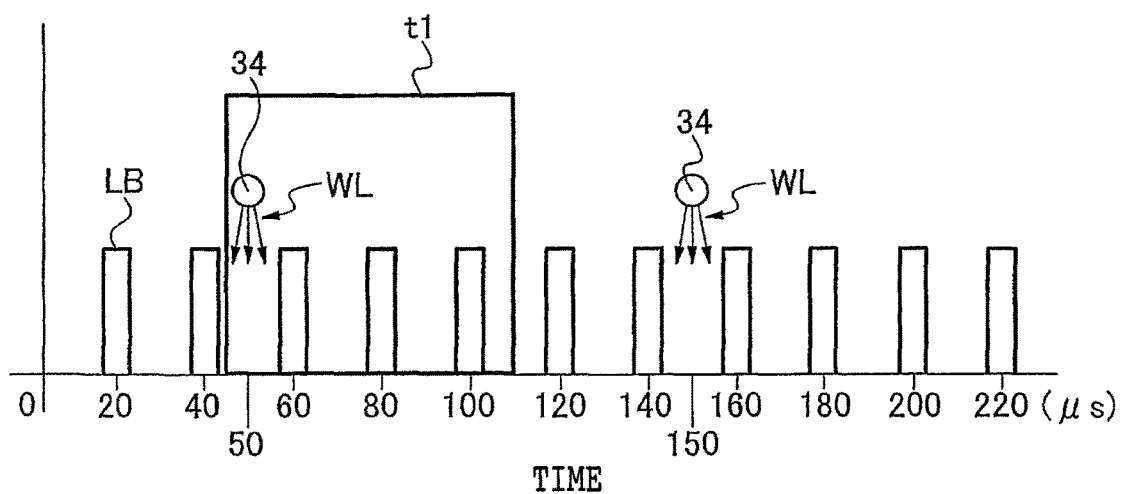
FIG. 7 is a timing chart depicting the timing between the application of a pulsed laser beam for laser processing and the application of light for kerf check.

In the example depicted in FIG. 7, white light WL is emitted from the strobe light source 341 after the elapse of 50 microseconds from the start of oscillation of the pulsed laser beam. Thereafter, the white light WL is emitted at 100 microseconds intervals. The white light WL thus emitted is applied to the wafer W held on the chuck table 2.

Figure 8:
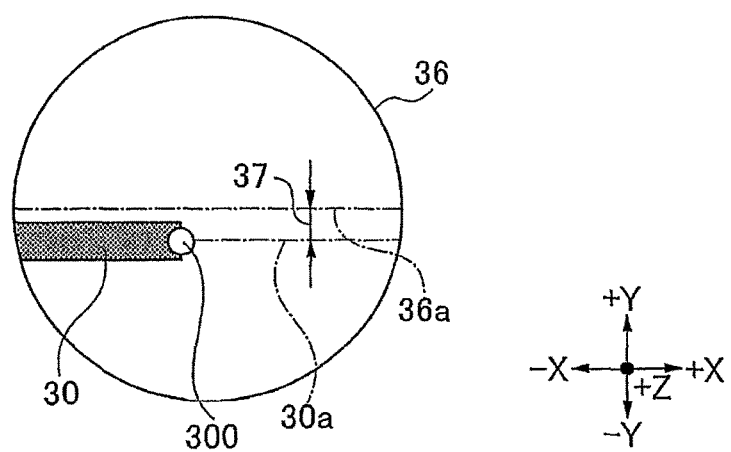
FIG. 8 is a plan view depicting the positional relation between a reference line set in imaging means and a beam plasma generated from the laser processed groove.

When the pulsed laser beam LB is applied to the wafer W, a beam plasma 300 is generated as depicted in FIG. 8. The image depicted in FIG. 8 is the image of the processing area obtained by the imaging means 36. The beam plasma 300 is guided through the focusing lens 321, the dichroic mirror 33, and the beam splitter 35 to the imaging means 36 at the timing of emission of the white light WL. The light guided to the imaging means 36 is passed through the set lens 361 composed of the aberration correcting lens 361a and the image forming lens 361b to enter the imaging device (CCD) 362, thereby forming an image. An image signal corresponding to this image obtained by the imaging device (CCD) 362 is transmitted to the control means 80. The control means 80 stores into the storage means 81 this image signal transmitted from the imaging device (CCD) 362 at 100 microseconds intervals. The beam plasma 300 is generated from the center of the laser processed groove 30 in its lateral direction, so that the position of the laser processed groove 30 can be detected by detecting the position of the beam plasma 300. The kerf check is started when the focusing means 32 comes to the position XS displaced from the center O of the wafer W by the amount X1 in the −X direction on the line LX4 as depicted in FIG. 3B. The time of start of the kerf check is depicted by the time 0 in FIG. 7.

As depicted in FIG. 8, a reference line 36a extending in the X direction is formed at the center of the imaging means 36. On the other hand, reference numeral 30a denotes a center line extending through the center of the beam plasma 300 in the X direction. This center line 30a of the beam plasma 300 is the same as the center line of the laser processed groove 30. When the center line 30a of the beam plasma 300 coincides with the reference line 36a, the control means 80 determines that the laser processed groove 30 is formed at a preset processing position on the line LX4, which is previously set in the alignment step. Conversely, when the center line 30a of the beam plasma 300 does not coincide with the reference line 36a, that is, when there is a deviation 37 between the center line 30a and the reference line 36a in the Y direction as depicted in FIG. 8, the control means 80 determines in the following manner. In the case that the deviation 37 is less than a predetermined threshold, the control means 80 determines that the laser processed groove 30 is formed at the preset processing position. This threshold is previously stored in the storage means 81. On the other hand, in the case that the deviation 37 is not less than the threshold, the control means 80 determines that the deviation 37 is not allowable (that is, the deviation between the center of the laser processed groove 30 and the center of the line LX4 is not allowable) and that the laser processed groove 30 is not formed at the preset processing position (desired position) on the line LX4. In this manner, the control means 80 measures the positional relation between the position of the beam plasma 300 and the preset processing position to thereby determine whether or not the laser processed groove 30 is formed at a desired position.

In the example depicted in FIG. 8, the center line 30a of the laser processed groove 30 is deviated from the reference line 36a in the −Y direction. Accordingly, when the control means 80 determines that the deviation 37 is not less than the threshold, the control means 80 immediately operates the motor 52 of the Y moving means 5 depicted in FIG. 1 while processing the line LX4, thereby shifting the chuck table 2 in the +Y direction by the deviation 37 to correct the Y position of the wafer W held on the chuck table 2. As a result, the reference line 36a coincides with the center line 30a of the laser processed groove 30 to be formed subsequently along the line LX4.

Alternatively, the correction of the processing position may be performed after completing the processing of the line LX4. Further, in the case that the focusing means 32 is movable in the Y direction, the Y position of the focusing means 32 may be shifted without moving the chuck table 2 in the Y direction. Also in this case, the position of the laser processed groove to be formed may be corrected.

In this manner, the beam plasma 300 is imaged and if the position of the beam plasma 300 is deviated from a desired position, correction can be made so that the laser processed groove 30 is to be formed at the desired position. Accordingly, in the following processing operation, the laser processed groove 30 can be accurately formed at the desired position. Furthermore, the beam plasma is imaged by the imaging means 36 of the laser beam applying means 3, so that the beam plasma can be imaged during the application of the pulsed laser beam. That is, the position of the beam plasma can be detected during processing of the target line for the kerf check. Accordingly, correction of the laser applying position can be immediately made according to the result of detection of the beam plasma.

While the kerf check is performed on the line LX4 where the metal patterns 17 and 18 are not formed in this preferred embodiment, the kerf check may be performed on the line where the metal patterns are formed. In this case, the kerf check may be performed so as to avoid the metal patterns.

While the kerf check is performed on the wafer having the metal patterns formed on the division lines in this preferred embodiment, the present invention is applicable also to a wafer having no metal patterns. In this case, it is unnecessary to store the positions of the metal patterns into the storage means 81. Accordingly, the position of the outermost line, the size of the wafer W, and the index size are stored into the storage means 81 before performing the alignment step. Further, in the processed position measuring step, the kerf check may be performed along any line.

The laser processing apparatus applicable in the present invention also includes a type such that two focusing means are provided and two pulsed laser beams can be simultaneously applied from the two focusing means to one division line to thereby form two parallel laser processed grooves along this division line. In the case of using this type of laser processing apparatus, two beam plasmas are imaged to determine a deviation between the reference line 36a and the middle point on the line connecting the centers of the two beam plasmas. If the deviation is not less than a predetermined threshold, correction is made similarly. Accordingly, the two laser processed grooves can be formed at desired positions on the common division line.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer by using a laser processing apparatus including pulsed laser beam applying means to apply a pulsed laser beam from said pulsed laser beam applying means to said wafer, said wafer including a substrate and a plurality of devices formed on a front side of said substrate in a plurality of separate regions defined by a plurality of crossing division lines, said wafer processing method comprising:
   an alignment step of detecting said division lines of said wafer by using alignment means included in said laser processing apparatus;
   a laser processed groove forming step of applying said pulsed laser beam from said pulsed laser beam applying means to said wafer along each division line after performing said alignment step, thereby forming a laser processed groove along each division line; and
   a processed position measuring step of imaging an area including a beam plasma generated by applying said pulsed laser beam from said pulsed laser beam applying means to said wafer, by using imaging means included in said laser processing apparatus, while performing said laser processed groove forming step, and next measuring the positional relation between the position of said beam plasma and a preset processing position;
   wherein said wafer further includes a plurality of metal patterns for testing arranged on said division lines at given intervals;
   said wafer processing method further comprises a metal pattern position storing step of storing information on the intervals and positions of said metal patterns into storage means included in said laser processing apparatus before performing said alignment step; and
   said positional relation is measured in said processed position measuring step at any position where said metal patterns are not formed, according to said information on the intervals and positions of said metal patterns previously stored in said metal pattern position storing step.

* * * * *